United States Patent
Cortes Salazar et al.

(10) Patent No.: US 11,236,249 B2
(45) Date of Patent: Feb. 1, 2022

(54) METHOD OF MANUFACTURING A CONDUCTIVE PATTERN

(71) Applicant: AGFA-GEVAERT NV, Mortsel (BE)

(72) Inventors: Fernando Cortes Salazar, Mortsel (BE); Koen Steert, Mortsel (BE); Vincent Courtet, Mortsel (BE); Karl Van Den Bossche, Mortsel (BE); Willem Gilbert, Mortsel (BE); Gert Daelemans, Mortsel (BE); Peter Willaert, Mortsel (BE)

(73) Assignee: AGFA-GEVAERT NV, Mortsel (BE)

( * ) Notice: Subject to any disclaimer, the term of this patent is extended or adjusted under 35 U.S.C. 154(b) by 0 days.

(21) Appl. No.: 16/762,171

(22) PCT Filed: Jun. 7, 2018

(86) PCT No.: PCT/EP2018/065063
§ 371 (c)(1),
(2) Date: May 7, 2020

(87) PCT Pub. No.: WO2019/096450
PCT Pub. Date: May 23, 2019

(65) Prior Publication Data
US 2020/0362186 A1  Nov. 19, 2020

(30) Foreign Application Priority Data

Nov. 14, 2017 (EP) .................................... 17201474

(51) Int. Cl.
*C09D 11/52* (2014.01)
*B41M 3/00* (2006.01)
(Continued)

(52) U.S. Cl.
CPC ............. *C09D 11/52* (2013.01); *B41M 3/006* (2013.01); *B41M 5/0047* (2013.01);
(Continued)

(58) Field of Classification Search
CPC ... B32B 2457/208; G06F 3/044; G06F 3/041; G01B 11/30; G01B 11/2408; H05K 3/386; H05K 3/38
See application file for complete search history.

(56) References Cited

U.S. PATENT DOCUMENTS 6,867,539 B1 *  3/2005  McCormick ........ H01L 51/5253
                                                   257/40
2005/0089635 A1  4/2005  Hasei
(Continued)

FOREIGN PATENT DOCUMENTS

EP  1911814 A1  4/2008
EP  2 671 927 A1  12/2013
(Continued)

OTHER PUBLICATIONS

Official Communication issued in International Patent Application No. PCT/EP2018/065063, dated Jul. 2, 2018.
(Continued)

*Primary Examiner* — Tabassom Tadayyon Eslami
(74) *Attorney, Agent, or Firm* — Leydig, Voit & Mayer, Ltd.

(57) ABSTRACT

A method of preparing a conductive pattern on a substrate includes the steps of applying a receiving layer on a substrate, applying a metallic nanoparticle dispersion on the white receiving layer thereby forming a metallic pattern, and sintering the metallic pattern, characterized in that the receiving layer has a roughness Rz between 1 and 75.

16 Claims, 1 Drawing Sheet

(51) Int. Cl.
*B41M 5/00* (2006.01)
*C09D 11/037* (2014.01)
*C09D 11/101* (2014.01)
*C09D 11/107* (2014.01)
*C09D 11/322* (2014.01)
*C09D 11/54* (2014.01)
*H05K 1/09* (2006.01)
*H05K 3/12* (2006.01)
*H05K 3/46* (2006.01)

(52) U.S. Cl.
CPC .......... *C09D 11/037* (2013.01); *C09D 11/101* (2013.01); *C09D 11/107* (2013.01); *C09D 11/322* (2013.01); *C09D 11/54* (2013.01); *H05K 1/097* (2013.01); *H05K 3/125* (2013.01); *H05K 3/4644* (2013.01); *H05K 2201/0108* (2013.01); *H05K 2203/013* (2013.01); *H05K 2203/1131* (2013.01)

(56) References Cited

U.S. PATENT DOCUMENTS

| | | | | |
|---|---|---|---|---|
| 2006/0090384 | A1* | 5/2006 | Woodruff | G09F 7/12 40/544 |
| 2009/0022988 | A1* | 1/2009 | Toyama | C08G 18/8022 428/355 CN |
| 2010/0328223 | A1* | 12/2010 | Mockarram-Dorri | G06F 1/1616 345/173 |
| 2013/0002777 | A1 | 1/2013 | Yano et al. | |
| 2014/0051207 | A1* | 2/2014 | Lee | H01L 51/003 438/99 |
| 2015/0202846 | A1* | 7/2015 | Byker | B32B 27/30 428/141 |
| 2016/0074941 | A1* | 3/2016 | Zissing | B22F 7/08 118/642 |
| 2018/0315953 | A1* | 11/2018 | Hu | B32B 17/06 |

FOREIGN PATENT DOCUMENTS

| | | | |
|---|---|---|---|
| EP | 3 017 960 | A1 | 5/2016 |
| EP | 3 037 161 | A1 | 6/2016 |
| JP | 2004-56106 | A | 2/2004 |
| JP | 2004-056106 | A | 2/2004 |
| JP | 2005-81335 | A | 3/2005 |
| JP | 2013-10236 | A | 1/2013 |
| JP | 2013-241507 | * | 5/2013 |
| JP | 2013-241507 | A | 12/2013 |
| WO | 2014/185256 | A1 | 11/2014 |

OTHER PUBLICATIONS

English Translation of Office Action relating to South Korean Patent Application No. 10-2020-7013610 dated Feb. 24, 2021, 5 pages.
Indian Patent Office, First Examination Report in Indian Patent Application No. 202017019939, dated Aug. 19, 2021.
Japanese Patent Office, Office Action in Japanese Patent Application No. 2020-526488, 10 pp. (dated Apr. 28, 2021).
English Translation of Office Action relating to Japanese Patent Application No. 2020-526488 dated Apr. 28, 2021, 5 pages.

* cited by examiner

METHOD OF MANUFACTURING A CONDUCTIVE PATTERN

CROSS REFERENCE TO RELATED APPLICATIONS

This application is a 371 National Stage Application of PCT/EP2018/065063, filed Jun. 7, 2018. This application claims the benefit of European Application No. 17201474.8, filed Nov. 14, 2017, which is incorporated by reference herein in its entirety.

BACKGROUND OF THE INVENTION

1. Field of the Invention

The invention relates to a method of preparing a conductive pattern on various substrates.

2. Description of the Related Art

The interest in metallic printing or coating fluids comprising metallic nanoparticles has increased during the last decades due to their unique properties when compared to the bulk properties of a given metal. For example, the melting point of metallic nanoparticles decreases with decreasing particle size making them of interest for printed electronics, electrochemical, optical, magnetic and biological applications.

The production of stable and concentrated metallic printing or coating fluids that can be printed, for example by inkjet printing, or coated at high speed is of great interest as it enables the preparation of electronic devices at low costs.

Metallic printing or coating fluids are typically metallic nanoparticle dispersions comprising metallic nanoparticles and a dispersion medium. Such metallic nanoparticle dispersions can be directly used as a printing or coating fluid. However, additional ingredients are often added to the metallic nanoparticle dispersion to optimize the properties of the resulting metallic printing or coating fluids.

Typically, after applying the metallic printing or coating fluids on a substrate, a sintering step, also referred to as curing step, at elevated temperatures is carried out to induce/enhance the conductivity of the applied patterns or layers.

Organic components of the metallic printing or coating fluids, for example polymeric dispersants, may reduce the sintering efficiency and thus the conductivity of the applied patterns or layers. For this reason, higher sintering temperatures and longer sintering times are often required to decompose such organic components.

EP-A 2671927 (Agfa Gevaert) discloses a metallic nanoparticle dispersion, for example a silver inkjet ink, comprising a specific dispersion medium, for example 2-pyrrolidone, resulting in a more stable dispersion without using a polymeric dispersant.

EP-A 3037161 (Agfa Gevaert) discloses a metallic nanoparticle dispersion comprising silver nanoparticles, a liquid carrier and specific dispersion stabilizing compounds.

Adhesion of the conductive patterns towards the substrate is often a problem. A sufficient adhesion may be realized on some substrates, while on others the adhesion may become unacceptable.

Adding an adhesion promotor to the metallic nanoparticle dispersion is one way to improve the adhesion on various substrates, as proposed in for example EP-A 3099146 (Agfa Gevaert) for an ITO substrate.

Near Infrared (NIR) sintering of, for example, silver layers or patterns typically increases the conductivity of such layers or patterns. However, when using transparent substrates the efficiency of the NIR sintering often decreases. Additionally, substrate deformation could occur when the substrate's glass transition temperature (Tg) is lower than the temperature achieved during NIR sintering. As a result, the definition and conductivity of the printed pattern may be negatively impacted.

Another problem when using different substrates upon which a conductive pattern is applied, for example by inkjet printing, is the dependency of the printing resolution on the substrate used.

There is thus a need for a method of preparing a conductive pattern on different substrates wherein the adhesion of the pattern towards the substrate, the efficiency of the NIR sintering step and as a consequene the conductivity of the pattern and the printing resolution of the pattern are sufficient on the different substrates.

SUMMARY OF THE INVENTION

It is an object of the present invention to provide a method of preparing a conductive pattern having a high conductivity, sufficient adhesion and a good resolution on various substrates.

This object is realized by the method as defined below.

Further advantages and embodiments of the present invention will become apparent from the following description.

DETAILED DESCRIPTION OF THE PREFERRED EMBODIMENTS

Definitions

Figure 1:
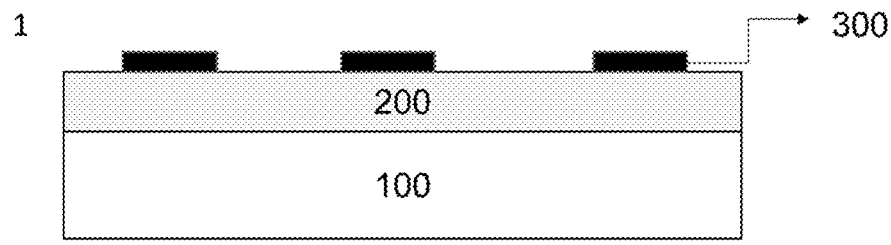
FIG. 1 represents a schematic representation of a conductive pattern prepared according to an embodiment of the invention.

The terms polymeric support and foil, as used herein, mean a self-supporting polymer-based sheet, which may be associated with one or more adhesion layers, e.g. subbing layers. Supports and foils are usually manufactured through extrusion.

The term layer as used herein, is considered not to be self-supporting and is manufactured by coating or spraying it on a (polymeric) support or foil.

PET is an abbreviation for polyethylene terephthalate.

The term alkyl means all variants possible for each number of carbon atoms in the alkyl group i.e. methyl, ethyl, for three carbon atoms: n-propyl and isopropyl; for four carbon atoms: n-butyl, isobutyl and tertiary-butyl; for five carbon atoms: n-pentyl, 1,1-dimethyl-propyl, 2,2-dimethyl-propyl and 2-methyl-butyl etc.

Unless otherwise specified a substituted or unsubstituted alkyl group is preferably a $C_1$ to $C_6$-alkyl group.

Unless otherwise specified a substituted or unsubstituted alkenyl group is preferably a $C_2$ to $C_6$-alkenyl group.

Unless otherwise specified a substituted or unsubstituted alkynyl group is preferably a $C_2$ to $C_6$-alkynyl group.

Unless otherwise specified a substituted or unsubstituted aralkyl group is preferably a phenyl group or a naphthyl group including one, two, three or more $C_1$ to $C_6$-alkyl groups.

Unless otherwise specified a substituted or unsubstituted alkaryl group is preferably a $C_1$ to $C_6$-alkyl group including an aryl group, preferably a phenyl group or naphthyl group.

Unless otherwise specified a substituted or unsubstituted aryl group is preferably a substituted or unsubstituted phenyl group or naphthyl group.

A cyclic group includes at least one ring structure and may be a monocyclic- or polycyclic group, meaning one or more rings fused together.

A heterocyclic group is a cyclic group that has atoms of at least two different elements as members of its ring(s). The counterparts of heterocyclic groups are homocyclic groups, the ring structures of which are made of carbon only. Unless otherwise specified a substituted or unsubstituted heterocyclic group is preferably a five- or six-membered ring substituted by one, two, three or four heteroatoms, preferably selected from oxygen atoms, nitrogen atoms, sulphur atoms, selenium atoms or combinations thereof.

An alicyclic group is a non-aromatic homocyclic group wherein the ring atoms consist of carbon atoms.

The term heteroaryl group means a monocyclic- or polycyclic aromatic ring comprising carbon atoms and one or more heteroatoms in the ring structure, preferably, 1 to 4 heteroatoms, independently selected from nitrogen, oxygen, selenium and sulphur. Preferred examples of heteroaryl groups include, but are not limited to, pyridinyl, pyridazinyl, pyrimidyl, pyrazyl, triazinyl, pyrrolyl, pyrazolyl, imidazolyl, (1,2,3,)- and (1,2,4)-triazolyl, pyrazinyl, pyrimidinyl, tetrazolyl, furyl, thienyl, isoxazolyl, thiazolyl, isoxazolyl, and oxazolyl. A heteroaryl group can be unsubstituted or substituted with one, two or more suitable substituents. Preferably, a heteroaryl group is a monocyclic ring, wherein the ring comprises 1 to 5 carbon atoms and 1 to 4 heteroatoms.

The term substituted, in e.g. substituted alkyl group means that the alkyl group may be substituted by other atoms than the atoms normally present in such a group, i.e. carbon and hydrogen. For example, a substituted alkyl group may include a halogen atom or a thiol group. An unsubstituted alkyl group contains only carbon and hydrogen atoms.

Unless otherwise specified a substituted alkyl group, a substituted alkenyl group, a substituted alkynyl group, a substituted aralkyl group, a substituted alkaryl group, a substituted aryl, a substituted heteroaryl and a substituted heterocyclic group are preferably substituted by one or more substituents selected from the group consisting of methyl, ethyl, n-propyl, isopropyl, n-butyl, 1-isobutyl, 2-isobutyl and tertiary-butyl, ester, amide, ether, thioether, ketone, aldehyde, sulfoxide, sulfone, sulfonate ester, sulphonamide, —Cl, —Br, —I, —OH, —SH, —CN and —$NO_2$.

Method of Preparing a Conductive Pattern

The method of preparing a conductive pattern on a substrate comprises the steps of:
  applying a receiving layer on a substrate,
  applying a metallic nanoparticle dispersion on at least a part of the receiving layer thereby forming a metallic pattern, and
  sintering the metallic pattern, characterized in that the receiving layer has a roughness Rz between 1 and 75.

It has been observed that the insertion of the receiving layer having a roughness between 1 and 75 between the substrate and the metallic pattern results in an improved adhesion of the pattern and a better printing resolution of the pattern.

The receiving layer is preferably a white receiving layer. It has been observed that the presence of such a white receiving layer results in a more efficient NIR curing resulting in a higher conductivity of the pattern.

The receiving layer may be applied on the substrate as a coating (FIG. 1, 200) covering substantially the entire substrate (FIG. 1, 100). The metallic nanoparticle dispersion is then applied on at least a part of the receiving layer (FIG. 1, 300).

However, the receiving layer may also be imagewise applied on the substrate.

Figure 2:
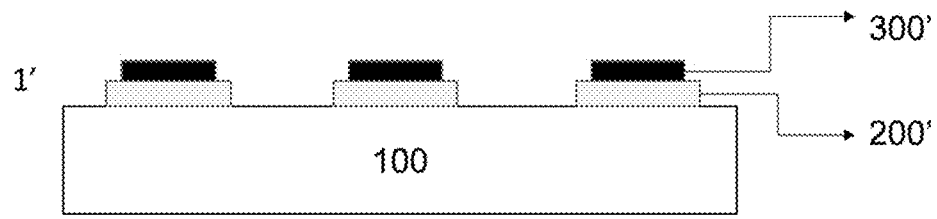
FIG. 2 represents a schematic representation of a conductive pattern prepared according to another embodiment of the invention.

For example, the receiving layer may be applied on the substrate (FIG. 2, 100) according to a first image (FIG. 2, 200'). The metallic nanoparticle is then applied on at least part of that first image (FIG. 2, 300').

Preferably, the receiving layer is printed slightly wider than the metallic nanoparticle dispersion, as depicted in FIG. 2, to ensure an improved adhesion, resolution and efficient NIR curing.

This can be realized with minimal use of additional ink, because with the high positioning accuracy of inkjet equipment, one could create the necessary pattern for the receiving layer (first image) by a simple "fattening" or "widening" of the metallic pattern (for example a silver circuitry). This could be accomplished quite easily in a digital workflow.

The receiving layer is preferably applied to the substrate as a UV curable inkjet ink by inkjet printing.

A UV curable inkjet ink is preferred to obtain a receiving layer with a sufficient roughness Rz and to realize a sufficient adhesion of the receiving layer on various substrates. The Rz obtained may optimized by adjusting the spreading properties of the inkjet ink, or by adjusting the UV curing parameters.

Although UV curable inkjet inks are preferred, also thermally curable inks can be employed and similar rough layers can be achieved by adjusting thermal curing parameters.

The metallic pattern is preferably provided onto the receiving layer by a printing method such as intaglio printing, screen printing, flexographic printing, offset printing, inkjet printing, gravure offset printing, etc.

The metallic pattern is preferably a silver pattern, for example a silver circuitry.

A preferred printing method for applying the metallic nanoparticle dispersion is an inkjet printing method.

The metallic nanoparticle dispersion is thus preferably an inkjet ink, more preferably a silver inkjet ink.

The roughness Rz of the receiving layer is between 1 to 75 μm, preferably between 2 μm and 60 μm, more preferably between 5 and 50 μm.

The roughness Ra of the receiving layer is preferably between 0.5 and 20 μm, more preferably between 1 and 15 μm, most preferably between 2 and 10 μm.

The thickness of the receiving layer is preferably between 10 and 500 μm, more preferably between 20 and 350 μm, most preferably between 30 and 250 μm.

In principle any substrate may be used in the method according to the present invention.

The substrate may be a metallic, a glass, a paper or a polymeric support.

Preferred substrates are described below.

Sintering Step

After the pattern is applied on the receiving layer, a sintering step, also referred to as curing step, is carried out.

During this sintering step, solvents evaporate and the metallic particles sinter together. Once a continuous percolating network is formed between the metallic particles, the conductivity of the pattern increases.

Conventional curing is typically carried out by applying heat. The curing temperature and time are dependent on the support used and on the composition of the metallic pattern.

The curing step may be performed at a temperature below 200° C., preferably below 180° C., more preferably below 150° C., most preferably below 130° C.

The curing time may be less than 60 minutes, preferably between 2 and 30 minutes and more preferably between 3 and 20 minutes, depending on the selected temperature, support and composition of the metallic pattern.

When low curing temperatures may be used, polymeric substrates that cannot withstand thermal treatment at high temperature, such as for example polyethyleneterephthalate (PET) or polystyrene (PS), may be used as substrates.

A reduced curing time may result in a higher production per hour of the metallic layers or patterns.

However, instead of or in addition to the conventional sintering by applying heat, alternative sintering methods such as exposure to an Argon laser, to microwave radiation, to UV radiation or to low pressure Argon plasma, photonic curing, plasma or plasma enhanced, electron beam, laser beam or pulse electric current sintering may be used.

In a particular preferred embodiment, the sintering step is carried out by Near Infrared (NIR) curing.

NIR curing is a radiative curing using NIR radiation, preferably radiation between 700 and 2500 nm.

Radiative curing techniques offer energy efficiency advantages because heating of the material is realized by direct absorption by the material itself. There is thus no need to preheat an entire oven.

The metal of the coating or the pattern, for example silver, may act as absorber for the NIR radiation.

To increase the absorption of the NIR radiation, NIR absorbing compounds may be added to the metallic layer or pattern. Such NIR absorbing compounds may be NIR absorbing pigments, such as carbon black or $TiO_2$, or NIR absorbing dyes, such as cyanine dyes.

Adding NIR absorbers to the metallic layer or pattern may however negatively influence the sintering process by disturbing the percolating network of the metallic particles.

It has been now observed that the type of substrate whereupon the metallic layer or pattern is applied may also influence the NIR curing efficiency. The NIR curing efficiency seems to be less efficient when transparent substrates are used, resulting in low conductivities of the metallic layer or pattern on such substrates.

By using a white receiving layer on such a transparent substrate, an increase of the NIR curing efficiency has been observed, resulting in a high conductivity of the metallic layer or pattern on such substrates.

Additionally, when using a white receiving layer on low thermally stable substrates, NIR sintering processes at temperatures higher than the Tg of the substrate can take place without substrate deformation.

To further increase the conductivity or to lower the curing temperature it may be advantageous to contact the silver layer or pattern with a solution containing an acid or an acid precursor capable or releasing the acid during curing of the metallic layer or pattern, as disclosed in EP-A 2821164 (Agfa Gevaert).

Receiving Layer

The receiving layer may be applied on the substrate by any conventional coating technique, such as dip coating, knife coating, extrusion coating, spin coating, spray coating, slide hopper coating and curtain coating.

The receiving layer may also be applied on the substrate by any printing method such as intaglio printing, screen printing, flexographic printing, offset printing, inkjet printing, tampon printing, valve jet printing, gravure offset printing, etc.

The receiving layer is preferably applied on the substrate by inkjet printing.

The white receiving layer preferably comprises a white pigment.

White Radiation Curable Inkjet Ink

The white receiving layer is preferably applied on the substrate by jetting and curing a white radiation curable composition.

The white radiation curable composition is preferably a white UV curable composition, more preferably a white UV curable inkjet ink, most preferably a white free radical UV curable inkjet ink.

However, a white UV curable cationic polymerizable inkjet ink may also be used. Also electron beam curable inkjet inks or thermally curable inkjet inks may be used to form the white receiving layer.

A UV curable inkjet ink is preferred to obtain a receiving layer with a sufficient roughness Rz.

The Rz obtained may be optimized by adjusting the spreading properties of the white inkjet ink, or by adjusting the UV curing parameters.

The white UV curable inkjet ink preferably comprises a white pigment, free radical polymerizable monomers and a photoinitiating system. The white UV curable inkjet ink may also comprise dispersants, inhibitors, surfactants and/or solvents.

White Pigment

The white receiving layer preferably includes a white pigment.

The white pigment has a high refractive index, preferably a refractive index greater than 1.60, preferably greater than 2.00, more preferably greater than 2.50 and most preferably greater than 2.60.

Such white pigments generally have a very high covering power. Unfortunately, such white pigments also generally exhibit a high sedimentation degree and speed.

Suitable white pigments having high refractive index are given by Table 1. The white pigments may be employed singly or in combination. The most preferred white pigment is titanium dioxide.

TABLE 1

| C.I. Number | Chemical name | CAS RN |
| --- | --- | --- |
| Pigment white 1 | Lead hydroxide carbonate | 1319-46-6 |
| Pigment white 3 | Lead sulphate | 7446-14-2 |
| Pigment white 4 | Zinc oxide | 1314-13-2 |
| Pigment white 5 | Lithopone | 1345-05-7 |
| Pigment white 6 | Titanium dioxide | 13463-67-7 |
| Pigment white 7 | Zinc sulphide | 1314-98-3 |
| Pigment white 10 | Barium carbonate | 513-77-9 |
| Pigment white 11 | Antimony trioxide | 1309-64-4 |
| Pigment white 12 | Zirconium oxide | 1314-23-4 |
| Pigment white 14 | Bismuth oxychloride | 7787-59-9 |
| Pigment white 17 | Bismuth subnitrate | 1304-85-4 |
| Pigment white 18 | Calcium carbonate | 471-34-1 |
| Pigment white 19 | Kaolin | 1332-58-7 |
| Pigment white 21 | Barium sulphate | 7727-43-7 |
| Pigment white 24 | Aluminum hydroxide | 21645-51-2 |
| Pigment white 25 | Calcium sulphate | 7778-18-9 |
| Pigment white 27 | Silicon dioxide | 7631-86-9 |

TABLE 1-continued

| C.I. Number | Chemical name | CAS RN |
|---|---|---|
| Pigment white 28 | Calcium metasilicate | 10101-39-0 |
| Pigment white 32 | Zinc phosphate cement | 7779-90-0 |

Titanium oxide occurs in the crystalline forms of anatase type, rutile type and brookite type.

The anatase type has a relatively low density and is easily ground into fine particles, while the rutile type has a relatively high refractive index, exhibiting a high covering power. Either one of these is usable in this invention. It is preferred to make the most possible use of characteristics and to make selections according to the use thereof. The use of the anatase type having a low density and a small particle size can achieve superior dispersion stability, ink storage stability and ejectability. At least two different crystalline forms may be used in combination. The combined use of the anatase type and the rutile type, which exhibits a high colouring power, can reduce the total amount of titanium oxide, leading to improved storage stability and ejection performance of ink.

For surface treatment of the titanium oxide, an aqueous treatment or a gas phase treatment may be applied, and an alumina-silica treating agent is usually employed. Untreated-, alumina treated- or alumina-silica treated-titanium oxide may be used.

Pigment particles in inkjet inks should be sufficiently small to permit free flow of the ink through the inkjet-printing device, especially at the ejecting nozzles. It is also desirable to use small particles to slow down sedimentation.

The numeric average particle diameter of the titanium oxide is preferably from 50 to 500 nm, more preferably from 150 to 400 nm, and most preferably from 200 to 350 nm. Sufficient hiding power cannot be obtained when the average diameter is less than 50 nm, and the storage ability and the jet-out suitability of the ink tend to be degraded when the average diameter exceeds 500 nm.

The white receiving layer preferably contains the white pigment in an amount of 5 wt % to 40 wt %, more preferably 8 to 30 wt % and most preferably 10 to 25 wt % relative to the total weight of the white inkjet ink.

The viscosity of the white UV curable inkjet ink is preferably smaller than 20 mPa·s at 45° C. and at a shear rate of 1000 $s^{-1}$, more preferably between 1 and 15 mPa·s at 45° C. and at a shear rate of 1000 $s^{-1}$.

The white UV curable inkjet ink may further also contain at least one surfactant for obtaining good spreading characteristics on a substrate. The surface tension of the white inkjet ink is preferably in the range of 18 mN/m to 70 mN/m at 25° C., more preferably in the range of 20 mN/m to 40 mN/m at 25° C., and most preferably in the range of 22 mN/m to 30 mN/m at 25° C.

Free Radical Polymerizable Monomers

The term free radical polymerizable monomers used here above and below includes not only monomers but also oligomers and pre-polymers.

Any monomer and oligomer capable of free radical polymerization may be used in the free radical UV curable white inkjet ink. The monomers and oligomers may have different degrees of polymerizable functionality, and a mixture including combinations of mono-, di-, tri- and higher polymerizable functionality monomers may be used. The viscosity of the UV curable inkjet ink can be adjusted by varying the ratio between the monomers.

The monomers and oligomers used, especially for food packaging applications, are preferably purified compounds having no or almost no impurities, more particularly no toxic or carcinogenic impurities. The impurities are usually derivative compounds obtained during synthesis of the polymerizable compound. Purification methods are well-known to those skilled in the art of manufacturing monomers and oligomers. Sometimes, however, some compounds may be added deliberately to pure polymerizable compounds in harmless amounts, for example, polymerization inhibitors or stabilizers.

Particularly preferred monomers and oligomers are those listed in [0106] to [0115] in EP-A 1911814 (AGFA).

For improving the adhesion on various substrates, the white UV curable inkjet ink preferably comprises a polymerizable compound selected from the group consisting of isobornylacrylate, phenoxyethyl acrylate, tetrahydrofurfuryl acrylate, 2-(2-vinyloxyethoxy)-ethyl (meth)acrylate and N-vinylcaprolactam.

Dispersants

The dispersant is preferably a polymeric dispersant. The dispersant is used to slow down sedimentation of the pigment in a pigmented inkjet ink, such as the free radical UV curable white inkjet ink.

Suitable polymeric dispersants are copolymers of two monomers but may contain three, four, five or even more monomers. The properties of polymeric dispersants depend on both the nature of the monomers and their distribution in the polymer. Copolymeric dispersants preferably have the following polymer compositions:

statistically polymerized monomers (e.g. monomers A and B polymerized into ABBAABAB);
  alternating polymerized monomers (e.g. monomers A and B polymerized into ABABABAB);
  gradient (tapered) polymerized monomers (e.g. monomers A and B polymerized into AAABAABBABBB);
  block copolymers (e.g. monomers A and B polymerized into AAAAABBBBBB) wherein the block length of each of the blocks (2, 3, 4, 5 or even more) is important for the dispersion capability of the polymeric dispersant;
  graft copolymers (graft copolymers consist of a polymeric backbone with polymeric side chains attached to the backbone); and
  mixed forms of these polymers, e.g. blocky gradient copolymers.

Suitable polymeric dispersants are listed in the section on "Dispersants", more specifically [0064] to [0070] and [0074] to [0077], in EP-A 1911814 (AGFA) incorporated herein as a specific reference.

The polymeric dispersant has preferably a number average molecular weight Mn between 500 and 30000, more preferably between 1500 and 10000.

The polymeric dispersant has preferably a weight average molecular weight Mw smaller than 100,000, more preferably smaller than 50,000 and most preferably smaller than 30,000. The polymeric dispersant has preferably a polydispersity PD smaller than 2, more preferably smaller than 1.75 and most preferably smaller than 1.5.

Commercial examples of polymeric dispersants are the following: DISPERBYK™ dispersants available from BYK CHEMIE GMBH; SOLSPERSE™ dispersants available from NOVEON; TEGO™ DISPERS™ dispersants from EVONIK; EDAPLAN™ dispersants from MÜNZING CHEMIE; ETHACRYL™ dispersants from LYONDELL; GANEX™ dispersants from ISP; DISPEX™ and EFKA™ dispersants from CIBA SPECIALTY CHEMICALS INC;

DISPONER™ dispersants from DEUCHEM; and JON-CRYL™ dispersants from JOHNSON POLYMER.

Particularly preferred polymeric dispersants include Solsperse™ dispersants from NOVEON, Efka™ dispersants from CIBA SPECIALTY CHEMICALS INC and Disperbyk™ dispersants from BYK CHEMIE GMBH. Particularly preferred dispersants are Solsperse™ 32000, 35000 and 39000 dispersants from NOVEON.

The polymeric dispersant is preferably used in an amount of 2 to 600 wt %, more preferably 5 to 200 wt %, most preferably 50 to 90 wt % based on the weight of the pigment.

Photoiniating System

The white UV curable inkjet ink preferably contains a photoinitiator for initiating the polymerization reaction under UV light exposure. The photoinitiator requires less energy to activate than the monomers, oligomers and/or prepolymers to form a polymer. The photoinitiator is preferably a free radical initiator, more specifically a Norrish type I initiator or a Norrish type II initiator.

A free radical photoinitiator is a chemical compound that initiates polymerization of monomers and oligomers when exposed to UV radiation by the formation of a free radical. A Norrish Type I initiator is an initiator which cleaves after excitation, yielding the initiating radical immediately. A Norrish type II-initiator is a photoinitiator which is activated by UV radiation and forms free radicals by hydrogen abstraction from a second compound that becomes the actual initiating free radical. This second compound is called a polymerization synergist or co-initiator. The co-initiator is not a photoinitiator because it is not activated by UV radiation. Both type I and type II photoinitiators can be used in the present invention, alone or in combination.

Suitable photoinitiators are disclosed in CRIVELLO, J. V., et al. VOLUME III: Photoinitiators for Free Radical Cationic. 2nd edition. Edited by BRADLEY, G., London, UK: John Wiley and Sons Ltd, 1998. p.287-294.

Specific examples of photoinitiators may include, but are not limited to, the following compounds or combinations thereof: benzophenone and substituted benzophenones, 1-hydroxycyclohexyl phenyl ketone, thioxanthones such as isopropylthioxanthone, 2-hydroxy-2-methyl-1-phenylpropan-1-one, 2-benzyl-2-dimethylamino-(4-morpholinophenyl) butan-1-one, benzil dimethylketal, bis (2,6-dimethylbenzoyl)-2,4,4-trimethylpentylphosphine oxide, 2,4,6trimethylbenzoyldiphenylphosphine oxide, 2-methyl-1-[4-(methylthio) phenyl]-2-morpholinopropan-1-one, 2,2-dimethoxy-1,2-diphenylethan-1-one or 5,7-diiodo-3-butoxy-6-fluorone.

Suitable commercial photoinitiators include Irgacure™ 184, Irgacure™ 500, Irgacure™ 369, Irgacure™ 1700, Irgacure™ 651, Irgacure™ 819, Irgacure™ 1000, Irgacure™ 1300, Irgacure™ 1870, Darocur™ 1173, Darocur™ 2959, Darocur™ 4265 and Darocur™ ITX available from CIBA SPECIALTY CHEMICALS, Lucerin™ TPO available from BASF AG, Esacure™ KT046, Esacure™ KIP150, Esacure™ KT37 and Esacure™ EDB available from LAMBERTI, H-Nu™ 470 and H-Nu™ 470X available from SPECTRA GROUP Ltd.

In order to increase the photosensitivity further, the UV curable ink may additionally contain co-initiators. Suitable examples of co-initiators can be categorized in three groups: 1) tertiary aliphatic amines such as methyldiethanolamine, dimethylethanolamine, triethanolamine, triethylamine and N-methylmorpholine; (2) aromatic amines such as amylparadimethylaminobenzoate, 2-n-butoxyethyl-4-(dimethyl-amino) benzoate, 2-(dimethylamino)ethylbenzoate, ethyl-4-(dimethylamino)benzoate, and 2-ethylhexyl-4-(dimethylamino)benzoate; and (3) (meth)acrylated amines such as dialkylamino alkyl(meth)acrylates (e.g., diethylaminoethylacrylate) or N-morpholinoalkyl-(meth)acrylates (e.g., N-morpholinoethyl-acrylate).

Preferred co-initiators are aminobenzoates.

Inhibitors

The white UV curable inkjet ink may contain a polymerization inhibitor.

Suitable polymerization inhibitors include phenol type antioxidants, hindered amine light stabilizers, phosphor type antioxidants, hydroquinone monomethyl ether commonly used in (meth)acrylate monomers, and hydroquinone, t-butylcatechol, pyrogallol may also be used.

Suitable commercial inhibitors are, for example, Sumilizer™ GA-80, Sumilizer™ GM and Sumilizer™ GS produced by Sumitomo Chemical Co. Ltd.; Genorad™ 16, Genorad™ 18 and Genorad™ 20 from Rahn AG; Irgastab™ UV10 and Irgastab™ UV22, Tinuvin™ 460 and CGS20 from Ciba Specialty Chemicals; Floorstab™ UV range (UV-1, UV-2, UV-5 and UV-8) from Kromachem Ltd, Additol™ S range (S100, S110, S120 and S130) from Cytec Surface Specialties.

Since excessive addition of these polymerization inhibitors will lower the ink sensitivity to curing, it is preferred that the amount capable of preventing polymerization is determined prior to blending. The amount of a polymerization inhibitor is preferably less than 2 wt % based on the total weight of the white inkjet ink.

Surfactants

The white UV curable inkjet ink may contain at least one surfactant. The surfactant can be anionic, cationic, non-ionic, or zwitter-ionic and is preferably added in a total quantity less than 3 wt % based on the total weight of the ink and particularly in a total less than 1 wt % based on the total weight of the safeguard liquid or the white inkjet ink.

Preferred surfactants are selected from fluoro surfactants (such as fluorinated hydrocarbons) and silicone surfactants. The silicone surfactants are preferably siloxanes and can be alkoxylated, polyester modified, polyether modified, polyether modified hydroxy functional, amine modified, epoxy modified and other modifications or combinations thereof. Preferred siloxanes are polymeric, for example polydimethylsiloxanes.

Preferred commercial silicone surfactants include BYK™ 333 and BYK™ UV3510 from BYK Chemie.

In a preferred embodiment, the surfactant is a polymerizable compound.

Preferred polymerizable silicone surfactants include a (meth)acrylated silicone surfactant. Most preferably the (meth)acrylated silicone surfactant is an acrylated silicone surfactant, because acrylates are more reactive than methacrylates.

In a preferred embodiment, the (meth)acrylated silicone surfactant is a polyether modified (meth)acrylated polydimethylsiloxane or a polyester modified (meth)acrylated polydimethylsiloxane.

Preferred commercially available (meth)acrylated silicone surfactants include: Ebecryl™ 350, a silicone diacrylate from Cytec; the polyether modified acrylated polydimethylsiloxane BYK™ UV3500 and BYK™ UV3530, the polyester modified acrylated polydimethylsiloxane BYK™ UV3570, all manufactured by BYK Chemie; Tego™ Rad 2100, Tego™ Rad 2200N, Tego™ Rad 2250N, Tego™ Rad 2300, Tego™ Rad 2500, Tego™ Rad 2600, and Tego™ Rad 2700, Tego™ RC711 from EVONIK; Silaplane™ FM7711, Silaplane™ FM7721, Silaplane™ FM7731, Silaplane™ FM0711, Silaplane™ FM0721, Silaplane™ FM0725, Silaplane™ TM0701, Silaplane™ TM0701T all manufactured by Chisso Corporation; and DMS-R05, DMS-R11, DMS-R18, DMS-R22, DMS-R31, DMS-U21, DBE-U22, SIB1400, RMS-044, RMS-033, RMS-083, UMS-182, UMS-992, UCS-052, RTT-1011 and UTT-1012 all manufactured by Gelest, Inc.

In a preferred embodiment, the safeguard liquid includes a surfactant which is also present in the safeguard liquid and the free radical UV curable white inkjet ink.

In a more preferred embodiment, the one or more surfactants in the safeguard liquid are identical to the one or more surfactants in the white UV curable inkjet ink.

Solvent

The white UV curable inkjet ink is preferably a non-aqueous ink. The term "non-aqueous" refers to a liquid carrier which should contain no water. However sometimes a small amount, generally less than 5 wt % of water based on the total weight of the ink, can be present. This water was not intentionally added but came into the composition via other components as a contamination, such as for example polar organic solvents. Higher amounts of water than 5 wt % tend to make the non-aqueous liquids and inks instable, preferably the water content is less than 1 wt % based on the total weight of radiation curable composition or ink and most preferably no water at all is present.

The white UV curable inkjet ink preferably does not contain an evaporable component such as an organic solvent. But sometimes it can be advantageous to incorporate a small amount of an organic solvent to improve adhesion to the surface of a substrate after UV-curing. In this case, the added solvent can be any amount in the range that does not cause problems of solvent resistance and VOC, and preferably 0.1-10.0 wt %, and particularly preferably 0.1-5.0 wt %, each based on the total weight of the curable ink.

The white UV curable inkjet ink most preferably includes no organic solvent or water.

Metallic Nanoparticle Dispersion

The metallic nanoparticle dispersion preferably comprises metallic nanoparticles and a liquid carrier. The metallic nanoparticle dispersions preferably further comprises a dispersion-stabilizing compound (DSC).

The metallic nanoparticle dispersion is preferably a silver ink, for example a silver flexo or screen ink, but more preferably a silver inkjet ink.

The metallic nanoparticle dispersion may further comprise a polymeric dispersant and additives to further optimize its properties.

Dispersion-Stabilizing Compound (DSC)

The silver inkjet ink preferably comprises silver nanoparticles, a liquid carrier and a dispersion-stabilizing compound (DSC) according to Formulae I, II, III or IV,

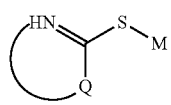

Formula I

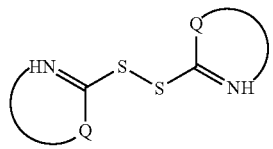

Formula II

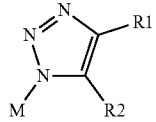

Formula III

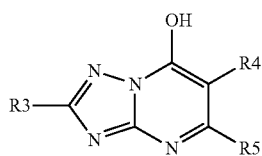

Formula IV wherein
Q represents the necessary atoms to form a substituted or unsubstituted five or six membered heteroaromatic ring;
M is selected from the group consisting of a proton, a monovalent cationic group and an acyl group;
R1 and R2 are independently selected from the group consisting of a hydrogen, a substituted or unsubstituted alkyl group, a substituted or unsubstituted alkenyl group, a substituted or unsubstituted alkynyl group, a substituted or unsubstituted alkaryl group, a substituted or unsubstituted aralkyl group, a substituted or unsubstituted aryl or heteroaryl group, a hydroxyl group, a thioether, an ether, an ester, an amide, an amine, a halogen, a ketone and an aldehyde;
R1 and R2 may represent the necessary atoms to form a five to seven membered ring;
R3 to R5 are independently selected from the group consisting of a hydrogen, a substituted or unsubstituted alkyl group, a substituted or unsubstituted alkenyl group, a substituted or unsubstituted alkynyl group, a substituted or unsubstituted alkaryl group, a substituted or unsubstituted aralkyl group, a substituted or unsubstituted aryl or heteroaryl group, a hydroxyl group, a thiol, a thioether, a sulfone, a sulfoxide, an ether, an ester, an amide, an amine, a halogen, a ketone, an aldehyde, a nitrile and a nitro group;
R4 and R5 may represent the necessary atoms to form a five to seven membered ring.

The dispersion-stabilizing compound is preferably a compound according to Formula I.

The dispersion-stabilizing compound is more preferably a compound according to Formula I, wherein Q represents the necessary atoms to form a five membered heteroaromatic ring.

A particular preferred dispersion-stabilizing compound is a compound according Formula I, wherein Q is a five membered heteroaromatic ring selected from the group consisting of an imidazole, a benzimidazole, a triazole, a benzothiazole, an oxazole, a benzoxazole, a 1,2,3-triazole, a 1,2,4-triazole, an oxadiazole, a thiadiazole and a tetrazole.

Some examples of dispersion-stabilizing compounds according to the present invention are shown in Table 2.

TABLE 2

| DSC | Chemical Formula |
|---|---|
| DCS-01 | ![structure] |

TABLE 2-continued
| DSC | Chemical Formula |
|---|---|
| DCS-02 | 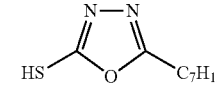 |
| DCS-03 | 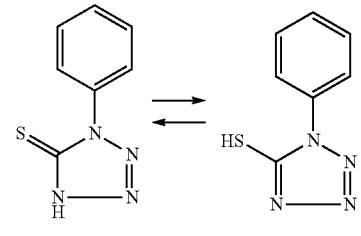 [SMILES: S=c1[nH]nnn1-c1ccccc1 ; Sc1nnnn1-c1ccccc1] |
| DCS-04 | 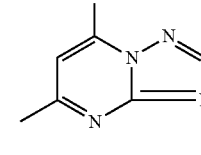 |
| DCS-05 | 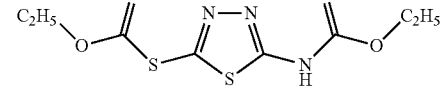 |
| DCS-06 | 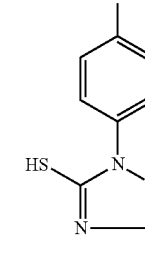 |
| DCS-07 | 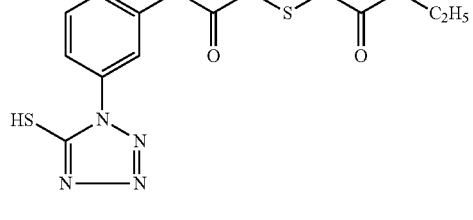 |
| DCS-08 | 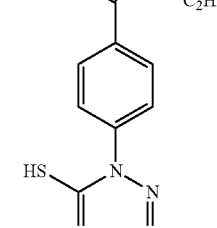 |
TABLE 2-continued
| DSC | Chemical Formula |
|---|---|
| DCS-09 | |
| DCS-10 | |
| DCS-11 | |
| DCS-12 | |
| DCS-13 | |
| DCS-14 | |
| DCS-15 | |

TABLE 2-continued

| DSC | Chemical Formula |
|---|---|
| DCS-16 | a phenyl-substituted triazole with HS and propyl-OH substituents |

The dispersion-stabilizing compound is preferably selected from the group consisting of N,N-dibutyl-(2,5-dihydro-5-thioxo-1H-tetrazol-1-yl-acetamide, 5-heptyl-2-mercapto-1,3,4-oxadiazole, 1-phenyl-5-mercaptotetrazol, 5-methyl-1,2,4-triazolo-(1,5-a) primidine-7-ol, and S-[5-[(ethoxycarbonyl)amino]-1,3,4-thiadiazol-2-yl] O-ethyl thiocarbonate.

The dispersion-stabilizing compounds according to Formula I to IV are preferably non-polymeric compounds. Non-polymeric compounds as used herein means compounds having a Molecular Weight which is less preferably than 1000, more preferably less than 500, most preferably less than 350.

The amount of the dispersion-stabilizing compounds (DSC) expressed as wt % relative to the total weight of silver (Ag) in the silver inkjet ink is preferably between 0.005 and 10.0, more preferably between 0.0075 and 5.0, most preferably between 0.01 and 2.5.

When the amount of the dispersion-stabilizing compound relative to the total weight of silver is too low, the stabilizing effect may be too low, while a too high amount of the dispersion-stabilizing compound may adversely affect the conductivity of the coating or patterns obtained with the silver inkjet ink.

Metallic Nanoparticles

The metallic nanoparticle dispersion of the present invention comprises metallic nanoparticles.

The metallic nanoparticles comprise one or more metals in elemental or alloy form. The metal is preferably selected from the group consisting of silver, gold, copper, nickel, cobalt, molybdenum, palladium, platinum, tin, zinc, titanium, chromium, tantalum, tungsten, iron, rhodium, iridium, ruthenium, osmium, aluminium and lead. Metallic nanoparticles based on silver, copper, molybdenum, aluminium, gold, copper, or a combination thereof, are particularly preferred. Most preferred metallic nanoparticles are silver nanoparticles.

The dispersed silver nanoparticles have an average particle size or average particle diameter, measured with Transmission Electron Microscopy, of less than 150 nm, preferably less than 100 nm, more preferably less than 50 nm, most preferably less than 30 nm.

The amount of silver nanoparticles in the inkjet is preferably at least 5 wt %, more preferably at least 10 wt %, most preferably at least 15 wt %, particularly preferred at least 20 wt %, relative to the total weight of the silver inkjet ink.

The silver nanoparticles are preferably prepared by the method disclosed in EP-A 2671927, paragraphs [0044] to and the examples.

Polymeric Dispersant

The metallic nanoparticle dispersion may contain a polymeric dispersant.

Polymeric dispersants typically contain in one part of the molecule so-called anchor groups, which adsorb onto the silver particles to be dispersed. In another part of the molecule, polymeric dispersants have polymer chains compatible with the dispersion medium, also referred to as liquid vehicle, and all the ingredients present in the final printing or coating fluids.

Polymeric dispersants are typically homo- or copolymers prepared from acrylic acid, methacrylic acid, vinyl pyrrolidinone, vinyl butyral, vinyl acetate or vinyl alcohol monomers.

The polymeric dispersants disclosed in EP-A 2468827, having a 95 wt % decomposition at a temperature below 300° C. as measured by Thermal Gravimetric Analysis may also be used.

However, in a preferred embodiment metallic nanoparticle dispersion comprises less than 5 wt % of a polymeric dispersant relative to the total weight of the dispersion, more preferably less than 1 wt %, most preferably less than 0.1 wt %. In a particularly preferred embodiment the dispersion comprises no polymeric dispersant at all.

Liquid Carrier

The metallic nanoparticle dispersion comprises a liquid carrier.

The liquid carrier is preferably an organic solvent. The organic solvent may be selected from alcohols, aromatic hydrocarbons, ketones, esters, aliphatic hydrocarbons, higher fatty acids, carbitols, cellosolves, and higher fatty acid esters.

Suitable alcohols include methanol, ethanol, propanol, 1-butanol, 1-pentanol, 2-butanol, t-butanol.

Suitable aromatic hydrocarbons include toluene and xylene.

Suitable ketones include methyl ethyl ketone, methyl isobutyl ketone, 2,4-pentanedione and hexa-fluoroacetone.

Also glycol, glycolethers, N,N-dimethyl-acetamide, N,N-dimethylformamide may be used.

A mixture of organic solvents may be used to optimize the properties of the metallic nanoparticle dispersion.

Preferred organic solvents are high boiling solvents. High boiling organic solvents referred to herein are solvents which have a boiling point that is higher than the boiling point of water (>100° C.)

Preferred high boiling solvents are shown in Table 3.

TABLE 3

| Chemical formula | Chemical name | Bp (° C.) |
|---|---|---|
| (structure) | 2-phenoxy ethanol (ethylene glycol monophenylether) | 247 |
| (structure) | 4-methyl-1,3-dioxolan-2-one (propylene carbonate) | 242 |
| (structure) | n-butanol | 117 |

TABLE 3-continued

| Chemical formula | Chemical name | Bp (° C.) |
|---|---|---|
| | 1,2-propanediol | 211-217 |
| | 4-hydroxy-4-methylpentan-2-one (diaceton alcohol) | 168 |
| | Pentan-3-one (diethyl ketone) | 102 |
| | 2-Butoxyethanol Ethylene glycol monobutyl ether | 171 |
| | Dihydrofuran-2(3H)-one (Gamma-butyrolacton) | 204 |
| | 2-pyrrolidon | 245 |
| | 1-methoxy-2-propanol (propyleneglycolmonomethylether) | 120 |

Particularly preferred high boiling solvents are 2-phenoxy ethanol, propylene carbonate, propylene glycol, n-butanol, 2-pyrrolidone and mixtures thereof.

The metallic nanoparticle dispersion preferably comprises at least 25 wt % of 2-phenoxyethanol, more preferably at least 40 wt %, based on the total weight of the silver ink.

Additives

To optimize the printing properties, and also depending on the application for which it is used, additives such as reducing agents, wetting/levelling agents, dewettting agents, rheology modifiers, adhesion agents, tackifiers, humectants, jetting agents, curing agents, biocides or antioxidants may be added to the metallic nanoparticle dispersion described above.

The metallic nanoparticle dispersion may comprise a surfactant. Preferred surfactants are Byk® 410 and 411, both solutions of a modified urea, and Byk® 430, a solution of a high molecular urea modified medium polar polyamide.

The amount of the surfactants is preferably between 0.01 and 10 wt %, more preferably between 0.05 and 5 wt %, most preferably between 0.1 and 0.5 wt %, relative to the total amount of the metallic nanoparticle dispersion.

It may be advantageous to add a small amount of a metal of an inorganic acid or a compound capable of generating such an acid during curing of a metallic layer or pattern formed from the metallic nanoparticle dispersion such as disclosed in EP-A 2821164. Higher conductivities and/or lower curing temperatures were observed of layers or patterns formed from such metallic nanoparticle dispersion.

Higher conductivities and/or lower curing temperatures may also be obtained when using metallic nanoparticle dispersion containing a compound according to Formula X, as disclosed in EP-A 3016763.

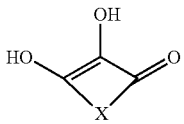

Formula X wherein
X represents the necessary atoms to form a substituted or unsubstituted ring.

A particularly preferred compound according to Formula X is an ascorbic or erythorbic acid derivative compound.

Preparation of the Metallic Nanoparticle Dispersion

The preparation of the metallic nanoparticle dispersion, for example a silver inkjet ink, typically comprises the addition of the liquid carrier, preferably the dispersion-stabilizing compound and optional additives to the metallic nanoparticles by using a homogenization technique such as stirring, high shear mixing, ultra-sonication, or a combination thereof.

The silver nanoparticles from which the silver inkjet ink is made is typically a paste or a highly concentrated dispersion of silver nanoparticles.

A preferred preparation method of the metallic nanoparticles is disclosed in EP-A 2671927.

It has been observed that better results are obtained when all, or a portion, of the dispersion-stabilizing compound are added during the preparation method of the silver nanoparticles. Due to their adsorption to the silver nanoparticles, the dispersion-stabilizing compounds added during the preparation of the silver nanoparticles will be retained, at least partially, in the final silver nanoparticle dispersion, even if one or more washing steps have been carried out in the preparation method.

The homogenization step can be carried out at elevated temperature up to 100° C. In a preferred embodiment, the homogenization step is carried out at temperature equal or below 60° C.

Inkjet Printing Devices

Various embodiments of an apparatus for creating the conductive patterns or the receiving layer by inkjet printing may be used.

In a flat bed printing device a support is provided on a flat bed. Droplets of a silver inkjet fluid are jetted from a print head on the support.

The print heads typically scan back and forth in a transversal direction (x-direction) across a moving support (y-direction). Such bi-directional printing is referred to as multi-pass printing.

Another preferred printing method is the so-called single-pass printing method wherein the print heads, or multiple staggered print heads, cover the entire width of the support. In such a single-pass printing method, the print heads usually remain stationary while the support is transported under the print heads (y-direction).

To obtain maximal dot placement accuracy, the print heads are positioned as close as possible to the surface of the support. The distance between the print heads and the surface of the support is preferably less than 3 mm, more preferably less than 2 mm, most preferably less than 1 mm.

As the distance between the print head and the surface of the support may influence the dot placement accuracy, it may be advantageous to measure the thickness of a support and adapting the distance between the print head and the surface of the support based on the measurement of the thickness of the support.

The distance between a stationary print head and the surface of a support mounted on the printing device may also vary over the whole support, due to for example waviness of the support, or other irregularities in the surface of the support. Therefore it may also be advantageous to measure the surface topography of the support and to compensate the differences in the measured surface topography by controlling the so-called firing time of the droplets of curable fluids on the support, or by adjusting the distance between the print head and the surface of the support. Examples of measurement devices to measure the surface topography of a lithographic supports is disclosed in ISO 12635:2008(E).

In a preferred embodiment the inkjet printing device has holding down means, such as a vacuum chamber under the support, to hold down the support in a so-called hold-down zone, for example by vacuum. In a more preferred embodiment the support is hold down against the support by independent working holding down means such as a plurality of vacuum chambers under the support which are independently controlled to enhance the vacuum pressure on the support so that more than one hold down zones are generated on the support. The holding down of the support enhances the drop placement of the jetted droplets and position accuracy.

Print Head

The UV curable inkjet ink and the silver inkjet ink may be jetted by one or more print heads ejecting small droplets of ink in a controlled manner through nozzles onto an ink-receiving layer surface, which is moving relative to the print head(s).

A preferred print head for the inkjet printing system is a piezoelectric head. Piezoelectric inkjet printing is based on the movement of a piezoelectric ceramic transducer when a voltage is applied thereto. The application of a voltage changes the shape of the piezoelectric ceramic transducer in the print head creating a void, which is then filled with ink. When the voltage is again removed, the ceramic expands to its original shape, ejecting a drop of ink from the print head. However the inkjet printing method according to the present invention is not restricted to piezoelectric inkjet printing.

Preferred print heads eject droplets having a volume ≤50 pL, for example ≤35 pL or ≤25 pL. It has been observed that droplets having a bigger volume result in a higher Roughness of the printed receiving layer.

Another preferred print head is a throughflow piezoelectric inkjet print head. A throughflow piezoelectric inkjet print head is a print head wherein a continuous flow of liquid is circulating through the liquid channels of the print head to avoid agglomerations in the liquid which may cause disturbing effects in the flow and bad drop placements. Avoiding bad drop placements by using throughflow piezoelectric inkjet print heads may improve the quality of the conductive patterns on the support. Another advantage of using such throughflow print heads is a higher viscosity limit of the curable fluids to be jetted, widening the scope of compositional variations of the fluids.

The inkjet print head normally scans back and forth in a transversal direction across the moving ink-receiving layer surface. Often the inkjet print head does not print on the way back. Bi-directional printing is preferred for obtaining a high areal throughput. Another preferred printing method is by a "single pass printing process", which can be performed by using page wide inkjet print heads or multiple staggered inkjet print heads which cover the entire width of the ink-receiving layer surface. In a single pass printing process the inkjet print heads usually remain stationary and the substrate surface is transported under the inkjet print heads.

The receiving layer may be applied in a single pass of a multipass printing process. A multipass printing process maybe preferred to achieve a sufficient thickness of the receiving layer.

Curing Device

The radiation curable composition is cured by exposing it to the proper radiation.

The UV curable inkjet ink is cured by exposure to ultraviolet radiation. The curing means may be arranged in combination with the white ink print head of the UV curable inkjet printer, travelling therewith so that the curing radiation is applied very shortly after jetting. Such rapid curing is sometimes referred to as "pin curing" and used for enhancing image quality by controlling the dot size. Preferably such curing means consists of one or more UV LEDs. In such an arrangement, it can be difficult to provide other types of curing means that are small enough to be connected to and travelling with the print head. Therefore, a static fixed radiation source may be employed, e.g. a source of curing UV-light, connected to the radiation source by means of flexible radiation conductive means such as a fiber optic bundle or an internally reflective flexible tube. Alternatively, the actinic radiation may be supplied from a fixed source to the radiation head by an arrangement of mirrors including a mirror upon the print head.

The source of radiation may also be an elongated radiation source extending transversely across the substrate to be cured. It may be adjacent the transverse path of the print head so that the subsequent rows of images formed by the print head are passed, stepwise or continually, beneath that radiation source.

Any ultraviolet light source, as long as part of the emitted light can be absorbed by the photo-initiator or photo-initiator system, may be employed as a radiation source, such as a high or low pressure mercury lamp, a cold cathode tube, a black light, an ultraviolet LED, an ultraviolet laser, and a flash light. Of these, the preferred source is one exhibiting a relatively long wavelength UV-contribution having a dominant wavelength of 300-400 nm. Specifically, a UV-A light source is preferred due to the reduced light scattering therewith resulting in more efficient interior curing.

UV radiation is generally classed as UV-A, UV-B, and UV-C as follows:
UV-A: 400 nm to 320 nm
UV-B: 320 nm to 290 nm
UV-C: 290 nm to 100 nm.

In a preferred embodiment, the inkjet printer contains one or more UV LEDs with a wavelength larger than 360 nm, preferably one or more UV LEDs with a wavelength larger than 380 nm, and most preferably UV LEDs with a wavelength of about 395 nm.

Furthermore, it is possible to cure the image using, consecutively or simultaneously, two light sources of differing wavelength or illuminance. For example, the first UV-source can be selected to be rich in UV-C, in particular in the range of 260 nm-200 nm. The second UV-source can then be rich in UV-A, e.g. a gallium-doped lamp, or a different lamp high in both UV-A and UV-B. The use of two UV-sources has been found to have advantages e.g. a fast curing speed and a high curing degree.

For facilitating curing, the inkjet printer often includes one or more oxygen depletion units. The oxygen depletion units place a blanket of nitrogen or other relatively inert gas (e.g. $CO_2$), with adjustable position and adjustable inert gas concentration, in order to reduce the oxygen concentration in the curing environment. Residual oxygen levels are usually maintained as low as 100 ppm, but are generally in the range of 200 ppm to 1200 ppm ultraviolet radiation.

Applications

With the method according to the present invention using a white receiving layer, highly conductive metallic layers or patterns may be realized on substrates that do not withstand high temperatures, such as polycarbonate (PC), polyethylene (PE), polypropylene (PP), polymethylacrylate (PMMA), polyvinylidenefluoride (PVDF), polytetrafluorethylene, Nylon-6,6, polyester, polyvinylchloride (PVC), or polystyrene (PS).

Such substrates may deform or melt when metallic patterns applied on them are sintered at high temperatures. It has also been observed that NIR curing of the metallic patterns may also result in deformation or melting of the substrate especially in those areas where the metallic pattern is present. It seems that the metallic pattern, for example a silver patterns, absorbs the NIR radiation used during sintering and converts it into heat and thereby induce deformation or melting of the substrate. The white receiving layer according to the invention provided between the substrate and the metallic pattern, seems to protect the substrate from the heat produced during NIR curing.

Such substrates preferably have a glass transition temperature (Tg) below 180° C., more preferably below 150° C., most preferably below 110° C.

The glass transition temperature (Tg) of the cured receiving layer is preferably higher then the Tg of the substrate.

The method according to the present invention may however also be used with substrates that withstand higher temperatures, such as polymers having a Tg of 180° C. or more (for example polyimide), glass or metal.

The method also enables to provide conductive metallic patterns on transparent substrates, such as for example polyethylene terephthalate (PET) substrates. When the metallic patterns are printed on such transparent substrates without a white receiving layer according to the present invention, NIR curing does not result in high conductivities of the metallic patterns.

When a white receiving layer is applied on such transparent substrates and the metallic patterns are printed on the white receiving layer, higher conductivities may be obtained upon NIR curing. A possible explanation could be that the white receiving layer reflects the NIR radiation towards the metallic pattern.

When the white receiving layer is only applied on those areas of the substrate where the conductive pattern will be printed, those areas not provided with a conductive pattern remains transparent.

With the method, highly conductive patterns may be provided on a FR-4 substrate, commonly used in the preparation of PCB. The method provides conductive patterns on such a FR-4 substrate having a good adhesion, high conductivity and a good resolution.

The latter may be employed in touch panels or so-called membrane switches.

Figure 3:
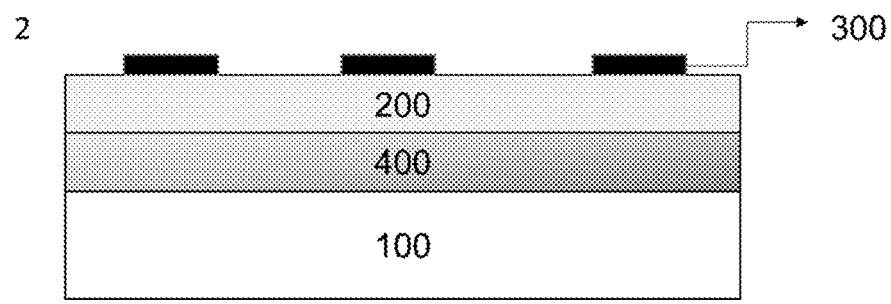
FIG. 3 represents a schematic representation of a conductive pattern prepared according to still another embodiment of the invention.

In such membrane switches (FIG. 3, 2), a transparent substrate (100), for example a PET substrate, is used as "touch" panel. A graphic design (400) is typically printed on the "inner" surface of the substrate (visible when viewed through the transparent substrate). The white receiving layer (200) is then positioned between the graphic design (400) and the conductive pattern (300).

A spacer layer may be applied between the graphic design and the conductive pattern, however, the white receiving layer layer may also act as spacer layer.

To visibly hide the conductive pattern (for example a silver circuitry) when viewed through the transparent substrate, the thickness of the white receiving layer layer may be optimized, for example increased. A black layer may be inserted between the substrate and the white receiving layer to even better hide the metallic pattern. The black layer may also be imagewise applied, in the same way as the white receiving layer.

On the "outer" surface of the PET substrate, an antiglare layer may be applied to the PET substrate. The conductive pattern is activated by touching the outer surface of the PET substrate.

EXAMPLES

Materials

All materials used in the following examples were readily available from standard sources such as ALDRICH CHEMICAL Co. (Belgium) and ACROS (Belgium) unless otherwise specified. The water used was deionized water.

AgInk-01 is a conductive silver inkjet printing ink SI-J20x, commercially available from Agfa Gevaert.

Wh04 is UV curable white inkjet ink commercially available as DIPAMAT™ Legend ink Wh04 from Agfa Gevaert.

FWh01 is a UV curable white inkjet ink commercially available as DIPAMAT™ Legend ink FWh01 from Agfa Gevaert.

G4 white is a UV curable white inkjet ink commercially available as ANAPURNA 500 UV inks from Agfa Graphics.

G5 white is a UV curable white inkjet ink commercially available as ANUVIA 050 White from Agfa Graphics.

G5 color is a UV curable color inkjet ink commercially available as ANAPURNA 500 UV inks from Agfa Graphics.

CurJet 062 is a UV curable white inkjet ink having a composition according to the following Table 4.

TABLE 4

| Ingredients | wt % |
| --- | --- |
| Tronox CR834 | 16.0 |
| Disperbyk-162 | 2.56 |
| Phenoxyethylacrylate | 32.84 |
| TBCH | 10.0 |
| ViCl | 20.0 |
| TPO | 2.95 |
| Genomer 1122 | 6.0 |
| CN963B80 | 4.0 |
| Esacure KT 046 | 4.0 |
| Tegoglide 410 | 0.3 |
| Irgastab UV 10 | 0.35 |
| INHIB | 1.00 |

TPO is 2,4,6-trimethylbenzoyldiphenylphosphine oxide, supplied by RAHN AG.

Autotex Velvet 150 polyester is a high quality textured polyester (thickness 150 μm) from MacDermid.

Tronox CR-834 is a $TiO_2$ pigment available from KERR-McGEE Corporation.

Disperbyk-162 is a wetting agent commercially available from BYK CHEMIE.

Phenoxyethylacrylate is a monofunctional acrylate available as SR339 from SpecialChem.

TBCH is 4-tert.butylcyclohexylacrylate available as SR217 from SpecialChem.

ViCl is N-vinylcaprolactam available from BASF.

Genomer 1122 is a monofunctional urethane acrylate available from RAHN.

CN963B80 is a difunctional aliphatic polyester urethane acrylate oligomer available from ARKEMA.

Esacure KT 046 is photoinitiator available from FRATELLI LAMBERTI.

Tegoglide 410 is a levelling agent available from EVONIK.

Stab UV 10 is a stabilizer available from AZELIS.

INHIB is a mixture forming a polymerization inhibitor having a composition according to Table 5.

TABLE 5

| Ingredients | wt % |
|---|---|
| DPGDA | 82.4 |
| p-methoxyphenol | 4.0 |
| 2,6-di-tert-butyl-4-methylphenol | 10.0 |
| Cupferron ™ AL | 3.6 |

DPGDA is dipropylenediacrylate, available as Sartomer SR508 from ARKEMA.

Cupferron™ AL is aluminum N-nitrosophenylhydroxylamine from WAKO CHEMICALS LTD.

Measurements Methods

Preparation of the White Receiving Layer Blade Coatings

All white receiving layer blade coating samples were prepared by using a polished stainless steel rod mounted on 2 "feet" (distance between the feet=20 cm). The thickness of the coating is then defined by the employed blade allowing commonly coating thicknesses ranging from 4 to 100 μm.

In the present case blade coatings with a thickness of 20 μm were prepared.

After the coating process, the coatings were cured by passing them through a Fusion UV curing apparatus (D bulb, lamp power 100%) with the help of a table belt running at a speed of 20 m/min resulting in hard and non-tacky (fully polymerized) coatings.

Measurement of the Surface Roughness of the Receiving Layer

Ra is the average roughness in the measured sample length. Rz is the average distance between the highest peak and lowest valley in each sample length. Both Ra and Rz were measured by using a mechanical surface roughness tester (Surtonic 5128 availabe from Taylor Hobson (Ametek)).

Each reported value represent the average of 6 measurements performed in both x- and y-direction along a distance of 8 mm of the prepared receiving layer.

Conductivity of the Silver Coatings

The surface resistance (SER) of the silver coatings was measured using a four-point collinear probe. The surface or sheet resistance was calculated by the following formula:

$$SER = (\pi/\ln 2)*(V/I)$$

wherein

SER is the surface resistance of the layer expressed in Ω/square;

$\pi$ is a mathematical constant, approximately equal to 3.14;

ln 2 is a mathematical constant equal to the natural logarithmic of value 2, approximately equal to 0.693;

V is voltage measured by voltmeter of the four-point probe measurement device;

I is the source current measured by the four-point probe measurement device.

For each sample, six measurements were performed at different positions of the coating and the average value was calculated.

The silver content $M_{Ag}$ (g/m$^2$) of the coatings was determined by WD-XRF.

The conductivity of the coated layers was then determined by calculating the conductivity as a percentage of the bulk conductivity of silver using the following formula:

$$\% Ag_{(bulk)} = \frac{\sigma_{Coat}}{\sigma_{Ag}} \times 100$$

$$\% Ag_{(bulk)} = \frac{\rho_{Ag}}{\sigma_{Ag} \times SER \times M_{Ag}} \times 100$$

wherein $\sigma_{Ag}$ the specific conductivity of silver (equal to 6.3×10$^7$ S/m), $\sigma_{Coat}$ is the specific conductivity of the Ag coating and $\rho_{Ag}$ is the density of silver (1.049×10$^7$ g/m$^3$).

Viscosity Measurements

Unless otherwise provided, viscosities were measured at 25° C. at a shear rate of 1000 using a commercially availabe viscosimeter for example as a DHR-2 Rheometer (double wall ring) from TA Instruments.

Example 1

5 different substrates S-01 to S-05 were prepared by printing 5 different receiving layers according to Table 4 with an Anapurna M2540i FB (BULB) printer (from Agfa) on a Autotex Velvet 150 polyester.

A silver square (2 cm×2 cm) was printed on the receiving layer of each substrate with the silver inkjet ink AgInk-01 using a Ceraprinter (from MGI ceradrop) equipped with a Konica Minolta 30 pL printhead (KM1024iLHE) ($E_{fab}$=14 μm, $E_{shift}$=35 μm).

All samples were sintered by using a Adphos NIR lamp (100% power but at different NIR sintering speeds) according to Table 6.

The conductivity and adhesion of the silver pattern are shown in Table 7.

TABLE 6

| Substrate | Receivng layer |
|---|---|
| S-01 | G5 Color (K = 75%, C = M = Y = 75%) |
| S-02 | G5 Color (Y = 100%) |
| S-03 | G5 Color (M = 100%) |
| S-04 | G5 Color (C = 100%) |
| S-05 | G4 white |

TABLE 7

| Example | Substrate | NIR sintering speed (mm/s) | Sheet Resistance (Ohm/sq) | Ag (g/m$^2$) | Bulk conductivity (%) | Adhesion (ISO2409) |
|---|---|---|---|---|---|---|
| COMP-01 | S-01 | 100 | 40.528 | — | | Flaked |
| COMP-02 | S-02 | 50 | 0.625 | 8.59 | 3.1 | Flaked |
| COMP-03 | S-03 | 10 | >>10$^6$ | 7.57 | 0 | 1 |
| COMP-04 | S-04 | 100 | 2.738 | 9.26 | 0.7 | 1 |
| INV-01 | S-05 | 10 | 0.141 | 8.37 | 14.1 | 0 |

Flaked in Table 7 means that the silver layer (and/or the receiving layer layer) was removed partially or totally from the substrate during the NIR sintering process.

It is clear from the results of Table 7 that a high conductivity is only obtained with INV-01, using a substrate carrying a receiving layer.

In addition, a better adhesion is also obtained with the substrate carrying the receiving layer.

Example 2

The substrates S-06 to S-14 were prepared by printing a white ink according to Table 8 on a Autotex Velvet 150 polyester.

S-06 to S-11 were prepared by printing the white ink on one side of the polyester with a single pass Microcraft printer using the print conditions according to Table 8.

S-12 and S-13 were prepared by inkjet printing the white ink on one side of the polyester in a multipass mode with a Anapurna M2540i FB (BULB) printer (from Agfa).

S-14 was prepared by blade coating a white ink on one side of the polyester as described above.

A silver square (2 cm×2 cm) was printed on the receiving layer of each substrate with the silver inkjet ink AgInk-01 using a Ceraprinter (from MGI ceradrop) equipped with a Konica Minolta 30 pL printhead (KM1024iLHE) ($E_{fab}$=14 μm, $E_{shift}$=35 μm) and sintered by using a NIR lamp (100% power, 10 mm/s platform speed).

TABLE 8

| Substrate | White ink | Printing conditions |
|---|---|---|
| S-06 | Wh04 | 720 × 720 (1 pass) |
| S-07 | Wh04 | 720 × 720 (2 passes) |
| S-08 | Wh04 | 720 × 720 (3 passes) |
| S-09 | FWh01 | 720 × 720 (1 pass) |
| S-10 | FWh01 | 720 × 720 (2 passes) |
| S-11 | FWh01 | 720 × 720 (3 passes) |
| S-12 | G4 white | Multipass Anapurna |
| S-13 | G5 White | Multipass Anapurna |
| S-14 | G5 White | Blade coating |

The conductivity and the adhesion of the silver pattern is shown in Table 9.

TABLE 9

| Example | Substrate | Sheet Resistance (Ohm/sq) | Adhesion (ISO2409) | Ra (μm) | Rz (μm) |
|---|---|---|---|---|---|
| INV-02 | S-06 | 0.613 | 0 | 0.3 | 1.6 |
| INV-03 | S-07 | 0.508 | 0 | 0.4 | 2.0 |
| INV-04 | S-08 | 0.258 | 0 | 0.3 | 1.8 |
| INV-05 | S-09 | 0.322 | 0 | 0.3 | 1.4 |
| INV-06 | S-10 | 0.239 | 0 | 0.4 | 2.6 |
| INV-07 | S-11 | — | 0 | 0.8 | 4.1 |
| INV-07 | S-12 | 0.039 | 0 | 4.4 | 23.3 |
| INV-09 | S-13 | 0.110 | 0 | 5.1 | 27.5 |
| COMP-05 | S-14 | ~$10^8$ | 0 | 0.5 | 0.1 |

It is clear from the results in Table 9 that a silver pattern printed on a receiving layer having an Rz between 1 and 75 results in a higher conductivity compared to a silver pattern printed on a receiving layer having an Rz lower than 1.

Example 3

The substrates S-15 to S-18 were prepared by applying a white ink according to Table 10 on a Autotex Velvet 150 polyester.

S-16 and S-17 were prepared by printing the white ink on one side of the polyester with a Anapurna M2540i FB (BULB) printer (from Agfa) using the printing conditions of Table 10.

S-15 and S-18 were prepared by blade coating a white ink on one side of the polyester as described above.

A silver square (2 cm×2 cm) was printed on the receiving layer of each substrate with the silver inkjet ink AgInk-01 using a Ceraprinter (from MGI ceradrop) equipped with a Konica Minolta 30 pL printhead (KM1024iLHE) ($E_{fab}$=14 μm, $E_{shift}$=35 μm) and sintered by using a NIR lamp (100% power, 10 mm/s platform speed).

TABLE 10

| Substrate | White ink | Printing conditions |
|---|---|---|
| S-15 | Curjet 062 | Blade coating |
| S-16 | G4 White | 720 × 720 (2 passes) |
| S-17 | G5 White | 720 × 720 (3 passes) |
| S-18 | G5 White | Blade coating |

A silver pattern was printed on the receiving layer of each substrate with the silver inkjet ink AgInk-01 using a Ceraprinter (from MGI ceradrop) equipped with a Konica Minolta 30 pL printhead (KM1024iLHE) ($E_{fab}$=14 μm, $E_{shift}$=35 μm) and sintered by using a NIR lamp (100% power, 10 mm/s platform speed).

The Roughness of the white receiving layer and the splat diameter of the silver droplets are shown in Table 11.

The splat diameter of a silver droplet corresponds to the diameter of the droplet deposited on a given substrate.

TABLE 11

| Example | Substrate | Spat diameter (μm) | Ra (μm) | Rz (μm) |
|---|---|---|---|---|
| COMP-06 | S-15 | 82 | 0.5 | 0.1 |
| INV-10 | S-16 | 63 | 4.9 | 26.2 |
| INV-11 | S-17 | 63 | 3.8 | 18.2 |
| COMP-07 | S-18 | 82 | 0.4 | 0.1 |

It is clear from the results in Table 11 that the splat diameter of a silver droplet decreases when the roughness of the white receiving layer increases. Such a decrease of the splat diameter results in a higher printing resolution.

Example 4

This example illustrates the application of a white receiving layer according to the present invention on a substrate that does not withstand high temperatures.

A G5 White coating was applied with a Anapurna M2540i FB (BULB) printer (from Agfa) using the printing conditions of Table 12 on white coins consisting of polystyrene. The coins had a diameter of 2 cm and a thickness of 3 mm.

A silver pattern was printed on coins with and without a G5 White coating using a Ceraprinter (available from MGI ceradrop) equipped with a Konica Minolta KM1024i LHE 30 pL printhead (Splat diameter=70 μm, $E_{fab}$=14 μm, $E_{shift}$=35 μm) and sintered by using a NIR lamp (50% power, but at different NIR sintering speeds) according to Table 12. Oven sintering could not be used as the coins deformed drastically after 30 minutes at 100° C. For the coins with a G5 White coating, the silver pattern was printed on the G5 White coating.

The conductivity and the adhesion of the silver pattern is given in Table 12.

TABLE 12

| Example | Substrate | NIR sintering | Sheet Resistance (Ohm/sq) | Adhesion (ISO2409) |
|---|---|---|---|---|
| COMP-08 | white coin | 100 mm/s, 1x | $2.6\ 10^7$ | 0 |
| COMP-09 | white coin | 50 mm/s, 1x | $6.2\ 10^7$ | 0 |
| COMP-10 | white coin | 50 mm/s, 2x | $5.7\ 10^7$ | 0 |
| INV-12 | white coin + G5 white | 50 mm/s, 4x | 0.343 | 0 |

For all coins without a G5 White coating, the substrate covered with silver was melted after NIR curing while this was not the case for the coin comprising the G5 White coating.

As the NIR curing conditions were rather moderate, it seems that the silver pattern absorbs the NIR radiation and probably converts it into heat, resulting in melting of the substrate.

The G5 White coating seems to protect the substrate from the heat produced by the silver pattern during NIR curing.

From Table 12 it is clear that high conductivities are only obtained with the coins comprising a G5 White coating.

The invention claimed is:

1. A method of preparing a conductive pattern on a substrate for making a touch panel device, the method comprising:
    applying a receiving layer on a substrate;
    applying a metallic nanoparticle dispersion directly on at least a portion of the receiving layer to define a metallic pattern; and
    sintering the metallic pattern; wherein
    the receiving layer has a roughness Rz between 15 μm and 75 μm.

2. The method according to claim 1, wherein the receiving layer is white.

3. The method according to claim 1, wherein the sintering of the metallic pattern is performed with Near Infrared (NIR) radiation.

4. The method according to claim 2, wherein the sintering of the metallic pattern is performed with Near Infrared (NIR) radiation.

5. The method according to claim 1, wherein the receiving layer is applied on the substrate according to a first image, and the metallic nanoparticle dispersion is applied on at least a portion of the first image to define the metallic pattern.

6. The method according to claim 1, wherein a thickness of the receiving layer is between 10 μm and 500 μm.

7. The method according to claim 1, further comprising:
    printing a graphic design between the substrate and the receiving layer.

8. The method according to claim 1, wherein the metallic pattern includes silver.

9. The method according to claim 8, wherein the silver is applied by jetting a silver inkjet ink.

10. The method according to claim 1, wherein the substrate is transparent.

11. The method according to claim 1, wherein the substrate has a Glass Transition Temperature (Tg) lower than 180° C.

12. The method according to claim 1, wherein the receiving layer is applied by jetting and curing a UV curable inkjet ink.

13. The method according to claim 12, wherein the UV curable inkjet ink includes a titanium oxide pigment.

14. The method according to claim 12, wherein the UV curable inkjet ink includes a polymerizable compound selected from the group consisting of isobornylacrylate, phenoxyethyl acrylate, tetrahydrofurfuryl acrylate, 2-(2-vinyloxy-ethoxy)ethyl (meth)acrylate, and N-vinylcaprolactam.

15. The method according to claim 1, wherein the receiving layer has a roughness Rz between 15 μm and 60 μm.

16. The method according to claim 1, wherein the receiving layer has a roughness Rz between 15 μm and 50 μm.

* * * * *